United States Patent
Sakamaki et al.

(10) Patent No.: US 12,114,402 B2
(45) Date of Patent: *Oct. 8, 2024

(54) HOLDING DEVICE AND METHOD OF MANUFACTURING HOLDING DEVICE

(71) Applicant: NGK SPARK PLUG CO., LTD., Nagoya (JP)

(72) Inventors: Ryunosuke Sakamaki, Nagoya (JP); Katsuya Takaoka, Nagoya (JP); Hiroshi Watanabe, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 1064 days.

This patent is subject to a terminal disclaimer.

(21) Appl. No.: 16/975,607

(22) PCT Filed: Nov. 13, 2019

(86) PCT No.: PCT/JP2019/044466
§ 371 (c)(1),
(2) Date: Aug. 25, 2020

(87) PCT Pub. No.: WO2020/105521
PCT Pub. Date: May 28, 2020

(65) Prior Publication Data
US 2020/0404747 A1  Dec. 24, 2020

(30) Foreign Application Priority Data

Nov. 19, 2018 (JP) ................................. 2018-216115
Nov. 19, 2018 (JP) ................................. 2018-216116

(51) Int. Cl.
*H05B 3/06* (2006.01)
*C04B 35/581* (2006.01)
(Continued)

(52) U.S. Cl.
CPC ............. *H05B 3/12* (2013.01); *C04B 35/581* (2013.01); *H05B 3/03* (2013.01); *H05B 3/06* (2013.01);
(Continued)

(58) Field of Classification Search
None
See application file for complete search history.

(56) References Cited

U.S. PATENT DOCUMENTS 7,126,090 B2   10/2006   Yamaguchi et al.
7,446,284 B2   11/2008   Fan et al.
(Continued)

FOREIGN PATENT DOCUMENTS

CN   101026119 A   8/2007
CN   107872903 A   4/2018
(Continued)

OTHER PUBLICATIONS

International Search Report for PCT/JP2019/044466 dated Jan. 7, 2020 [PCT/ISA/210].
(Continued)

*Primary Examiner* — Thien S Tran
(74) *Attorney, Agent, or Firm* — Sughrue Mion, PLLC

(57) ABSTRACT

A holding device including a ceramic member formed of a sintered ceramic material containing aluminum nitride as a main component, a heating resistor element formed of a metal and disposed in the ceramic member, and an electrically conductive electricity supply member in contact with the heating resistor element. The holding device holds an object on the surface of the ceramic member. In the holding device, at least a portion of the surface of the heating resistor element, excluding its contact surface for contact with the electricity supply member, is covered with a coat layer formed of a nitride containing at least one of Al, Ti, Zr, V,
(Continued)

Ta, and Nb. Also disclosed is a method of manufacturing the holding device.

8 Claims, 7 Drawing Sheets

(51) Int. Cl.
  *H01L 21/683* (2006.01)
  *H05B 3/03* (2006.01)
  *H05B 3/12* (2006.01)
  *H05B 3/20* (2006.01)
  *H05B 3/28* (2006.01)
  *H05B 3/74* (2006.01)

(52) U.S. Cl.
  CPC .............. *H05B 3/20* (2013.01); *H05B 3/283* (2013.01); *H05B 3/74* (2013.01); *H01L 21/683* (2013.01); *H05B 2203/016* (2013.01)

(56) References Cited

U.S. PATENT DOCUMENTS

| | | | |
|---|---|---|---|
| 10,626,501 | B2 | 4/2020 | Kurano et al. |
| 2003/0183615 | A1 | 10/2003 | Yamaguchi et al. |
| 2005/0045618 | A1* | 3/2005 | Ito .................... C04B 35/62655 219/548 |
| 2005/0194374 | A1* | 9/2005 | Gelatos ................ H05B 3/283 219/468.1 |
| 2006/0216533 | A1 | 9/2006 | Kobayashi et al. |
| 2007/0138601 | A1 | 6/2007 | Fan et al. |
| 2007/0257022 | A1* | 11/2007 | Lin ...................... H05B 3/283 219/443.1 |
| 2009/0283933 | A1 | 11/2009 | Kobayashi et al. |
| 2010/0154203 | A1* | 6/2010 | Lin ...................... H05B 3/265 29/621 |
| 2010/0187220 | A1* | 7/2010 | Choi ................ H01C 17/06526 29/613 |
| 2010/0244350 | A1* | 9/2010 | Fujisato ........... H01L 21/68785 269/289 R |
| 2012/0318785 | A1 | 12/2012 | Kushihashi et al. |
| 2018/0087153 | A1 | 3/2018 | Kurano et al. |
| 2021/0037613 | A1* | 2/2021 | Sakamaki ............. C04B 37/005 |

FOREIGN PATENT DOCUMENTS

| | | |
|---|---|---|
| JP | 61-179084 A | 8/1986 |
| JP | 7-135068 A | 5/1995 |
| JP | 2003-288975 A | 10/2003 |
| JP | 2006-273586 A | 10/2006 |
| JP | 3888531 B2 | 3/2007 |
| JP | 2007-273992 A | 10/2007 |
| JP | 2016-042457 A | 3/2016 |
| KR | 10-1776581 B1 | 9/2017 |
| KR | 20230150707 A * | 10/2023 |
| WO | WO-2022072382 A1 * | 4/2022 |

OTHER PUBLICATIONS

Communication dated Nov. 29, 2021, issued by the State Intellectual Property Office of the P.R.C. in application No. 201980007526.3.
Communication issued Oct. 9, 2021 from the China National Intellectual Property Administration in Chinese Application No. 201980007168.6.
International Search Report for PCT/JP2019/044467 dated Jan. 7, 2020 (PCT/ISA/210).
Office Action issued Jan. 2, 2024 in U.S. Appl. No. 16/975,527.
Office Action issued Aug. 30, 2023 in U.S. Appl. No. 16/975,527.
Office Action issued Apr. 14, 2023 in U.S. Appl. No. 16/975,527.
Office Action issued May 2, 2024 in U.S. Appl. No. 16/975,527.

* cited by examiner

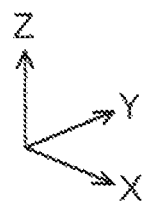
FIG.1
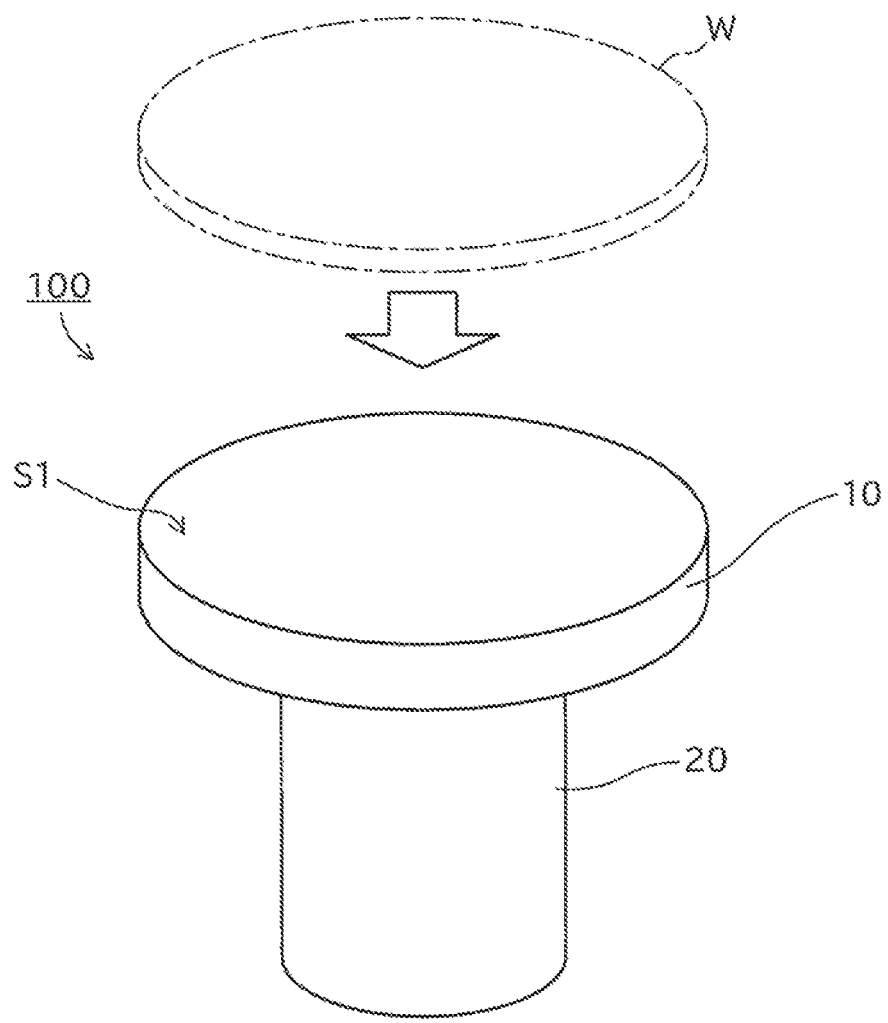

FIG.7

| Sample No. | Material of heating resistor element 50 | Shape of heating resistor element 50 | Manner of connection between heating resistor element 50 and electricity receiving electrodes 53 | Coat layer 60 Material | Coat layer 60 Thickness t1 (μm) | Average diameter of pores P0 at interface (μm) | Sectional area ratio of altered layer TL (%) | Variation in resistance of heating resistor element 50 (%) (n=20) | Variation in temperature of holding surface 51 (@500°C) |
|---|---|---|---|---|---|---|---|---|---|
| SA1 | Mo | Mesh | Connection member 51 | (Al,Ti)N | 0.2 | 4 | 8 | 20 | B |
| SA2 | W | Mesh | Connection member 51 | ZrN | 64 | 16 | 7 | 19 | B |
| SA3 | W-Mo | Mesh | Connection member 51 | (Al,Ti,Si)N | 0.2 | 3 | 7 | 21 | B |
| SA4 | W-Re | Mesh | Connection member 51 | (Al,Zr)N | 68 | 18 | 8 | 21 | B |
| SA5 | Mo | Mesh | Connection member 51 | TiN | 0.5 | 0.4 | 5 | 16 | B |
| SA6 | W | Mesh | Connection member 51 | VN | 0.8 | 0.6 | 6 | 15 | B |
| SA7 | W | Mesh | Connection member 51 | (Al,Ti,Cr)N | 0.3 | 0.3 | 5 | 14 | B |
| SA8 | Mo | Mesh | Connection member 51 | (Al,Ti)N | 60 | 14 | 5 | 15 | B |
| SA9 | W | Mesh | Connection member 51 | TaN | 2 | 1.5 | 6 | 11 | B |
| SA10 | W-Mo | Mesh | Connection member 51 | (Al,Zr)N | 4 | 2.5 | 4 | 9 | B |
| SA11 | W-Re | Mesh | Connection member 51 | AlN | 7 | 4 | 5 | 8 | B |
| SA12 | Mo | Mesh | Connection member 51 | ZrN | 15 | 10 | 5 | 9 | B |
| SA13 | W | Mesh | Connection member 51 | TiN | 12 | 5 | 4 | 8 | B |
| SA14 | W | Mesh | Connection member 51 | NbN | 10 | 6 | 3 | 4 | A |
| SA15 | W | Mesh | Connection member 51 | (Al,Ti,Cr)N | 1 | 0.5 | 3 | 3 | A |
| SA16 | Mo | Mesh | Connection member 51 | ZrN | 2 | 1 | 3 | 4 | A |
| SA17 | Mo | Foil | Direct | (Al,Zr)N | 3 | 2 | 2 | 2 | A |
| SA18 | W | Foil | Direct | AlN | 5 | 2.5 | 2 | 2 | A |
| SA19 | Mo | Foil | Direct | ZrN | 5 | 2 | 3 | 2 | A |
| SA20 | Mo | Foil | Direct | TiN | 5 | 3 | 2 | 2 | A |
| SA21 | W | Mesh | Connection member 51 | — | — | — | 19 | 54 | X |
| SA22 | W | Mesh | Connection member 51 | — | — | — | 22 | 49 | X |
| SA23 | Mo | Mesh | Connection member 51 | — | — | — | 31 | 58 | X |
| SA24 | Mo | Mesh | Connection member 51 | — | — | — | 28 | 54 | X |
| SA25 | W | Mesh | Connection member 51 | — | — | — | 29 | 53 | X |

HOLDING DEVICE AND METHOD OF MANUFACTURING HOLDING DEVICE

CROSS REFERENCE TO RELATED APPLICATIONS

This application is a National Stage of International Application No. PCT/JP2019/044466 filed Nov. 13, 2019, claiming priority based on Japanese Patent Application Nos. 2018-216115 filed Nov. 19, 2018 and 2018-216116 filed Nov. 19, 2018.

TECHNICAL FIELD

The technique disclosed in the present specification relates to a holding device for holding an object.

BACKGROUND ART

There has been known a heating device (also called a "susceptor") which heats an object (for example, a semiconductor wafer) to a predetermined temperature (for example, about 400 to 800° C.) while holding the object. The heating device is used, for example, as a portion of a semiconductor manufacturing apparatus such as a film formation apparatus (a CVD film formation apparatus, a sputtering film formation apparatus, etc.) or an etching apparatus (a plasma etching apparatus, etc.).

In general, such a heating device includes a ceramic member formed of a sintered ceramic material. A heating resistor element formed of, for example, a metal such as tungsten (W) or molybdenum (Mo) is disposed in the ceramic member, and electrically conductive electricity supply members are in contact with the heating resistor element. When a voltage is applied to the heating resistor element through the electricity supply members, the heating resistor element generates heat, so that an object held on a surface of the ceramic member (hereinafter referred to as the "holding surface") is heated.

When the heating device is manufactured, a compact formed of the material of the ceramic member and including the material of the heating resistor element disposed therein is fired at a high temperature (for example, about 1,700 to 1,900° C.), whereby the ceramic member formed of a dense sintered ceramic material and the heating resistor element disposed in the ceramic member are manufactured. During the firing, an impurity (impurities) (for example, carbon) originating from raw materials or the atmosphere within a furnace may enter the compact of the material of the ceramic member before being densified, and react with the heating resistor element, thereby forming an altered layer (for example, a tungsten carbide layer or a molybdenum carbide layer) on the surface of the heating resistor element. If such an altered layer is formed on the surface of the heating resistor element, a variation (intra-product and/or inter-product variation) in the resistance of the heating resistor element may arise. This may result in occurrence of a variation in the amount of heat generated by the heating resistor element and a variation in the temperature of the holding surface of the ceramic member (and thus, the temperature of the object held on the holding surface). A conventionally known technique for suppressing formation of the altered layer on the surface of the heating resistor element involves adjustment of the relative density and firing conditions of the ceramic member (see, for example, Patent Document 1).

PRIOR ART DOCUMENT

Patent Document

Patent Document 1: JP2006-273586A

SUMMARY OF THE INVENTION

Problem to be Solved by the Invention

The above-described conventional technique cannot sufficiently suppress formation of an altered layer on the surface of the heating resistor element. As a result, the above-described conventional technique has a problem of being incapable of sufficiently suppressing the variation in the resistance (heat generation amount) of the heating resistor element and therefore being incapable of sufficiently suppressing the variation in the temperature of the holding surface of the ceramic member (and thus, the temperature of the object held on the holding surface).

Notably, such problem is a common problem that occurs not only in the heating device having the above-described structure but also in a holding device which includes a ceramic member formed of a sintered ceramic material, a heating resistor element formed of a metal and disposed in the ceramic member, and electrically conductive electricity supply members in contact with the heating resistor element, and which holds an object on a surface of the ceramic member.

The present specification discloses a technique capable of solving the above-described problem.

Means for Solving the Problem

The technique disclosed in the present specification can be embodied, for example, in the following aspects.

(1) A holding device disclosed in the present specification comprises a ceramic member having a first surface approximately perpendicular to a first direction and formed of a sintered ceramic material containing aluminum nitride as a main component; a heating resistor element formed of a metal and disposed in the ceramic member; and an electricity supply member which is electrically conductive and is in contact with the heating resistor element, the holding device being adapted to hold an object on the first surface of the ceramic member, wherein at least a portion of a surface of the heating resistor element, excluding its contact surface for contact with the electricity supply member, is covered with a coat layer formed of a nitride containing at least one of Al, Ti, Zr, V, Ta, and Nb. In the present holding device, by virtue of the presence of the coat layer covering the surface of the heating resistor element, it is possible to suppress formation of an altered layer on the surface of the heating resistor element during firing of the ceramic member, which altered layer is formed as a result of the heating resistor element reacting with an impurity (impurities). Thus, it is possible to suppress occurrence of a variation in the amount of heat generated by the heating resistor element due to a variation in the resistance of the heating resistor element. As a result, it is possible to suppress a variation in the temperature of the first surface of the ceramic member (and thus, the temperature of the object held on the first surface). Also, since the coat layer is formed of a nitride containing at least one of Al, Ti, Zr, V, Ta, and Nb, during high temperature firing, the coat layer has heat resistance, and element diffusion into the ceramic member whose main component is aluminum nitride is less likely to occur. Accordingly, in the present holding device, while a change in the characteristics of the ceramic member due to the element diffusion from the coat layer can be suppressed, presence of the coat layer having high heat resistance makes it possible to suppress formation of an altered layer on the surface of the heating resistor element, and thus to suppress a variation in the resistance (heat generation amount) of the heating resistor element. As a result, it is possible to suppress a variation in the temperature of the first surface of the ceramic member (and thus, the temperature of the object held on the first surface).

(2) In the above-described holding device, the coat layer may have a thickness of 0.3 µm to 60 µm. When such a configuration is employed, the thickness of the coat layer is not excessively small (0.3 µm or greater). Therefore, by virtue of presence of the coat layer, it is possible to more reliably suppress formation of an altered layer on the surface of the heating resistor element. Also, when such a configuration is employed, since the thickness of the coat layer is not excessively large (60 µm or less), it is possible to reduce stress which is produced in the coat layer due to the difference in linear expansion between the heating resistor element and the coat layer. As a result, it is possible to prevent occurrence of a situation in which a crack is developed in the coat layer due to the stress and formation of the altered layer cannot be suppressed.

(3) In the above-described holding device, in at least one cross section parallel to the first direction, pores present at an interface between the heating resistor element and the coat layer may have an average diameter of 10 µm or less. When such a configuration is employed, the diameters of pores present at the interface between the heating resistor element and the coat layer are relatively small. Therefore, it is possible to suppress invasion of an impurity (impurities) through the pores present at the interface, thereby more reliably suppressing formation of the altered layer on the surface of the heating resistor element. Also, when such a configuration is employed, since the diameters of the pores present at the interface between the heating resistor element and the coat layer are relatively small, it is possible to suppress crushing of the pores and resultant development of a crack in the coat layer when pressing force is applied to the heating resistor element and the coat layer. This also contributes to more reliable suppression of formation of the altered layer on the surface of the heating resistor element.

(4) In the above-described holding device, in at least one cross section parallel to the first direction, the ratio of a sectional area of a carbide layer formed on the surface of the heating resistor element to a sectional area of the heating resistor element may be 10% or less. When such a configuration is employed, the amount of the carbide layer (altered layer) formed on the surface of the heating resistor element is small. Therefore, a holding device which exhibits a small variation in the resistance (heat generation amount) of the heating resistor element can be realized.

(5) In the above-described holding device, in at least one cross section parallel to the first direction, the ratio of a sectional area of a carbide layer formed on the surface of the heating resistor element to a sectional area of the heating resistor element may be 3% or less. When such a configuration is employed, the amount of the carbide layer (altered layer) formed on the surface of the heating resistor element is smaller. Therefore, a holding device which exhibits a smaller variation in the resistance (heat generation amount) of the heating resistor element can be realized.

(6) The above-described holding device may be configured such that the electricity supply member contains no organic substance. When such a configuration is employed, it is possible to suppress formation of an altered layer on the surface of the heating resistor element due to reaction of the heating resistor element with an organic substance(s) originating from the electricity supply member.

(7) In the above-described holding device, the heating resistor element may have a mesh shape. When such a configuration is employed, adhesion between the heating resistor element and the ceramic member can be enhanced.

(8) A method of manufacturing a holding device disclosed in the present specification is used for manufacturing a holding device which comprises a ceramic member having a first surface approximately perpendicular to a first direction and formed of a sintered ceramic material containing aluminum nitride as a main component, a heating resistor element formed of a metal and disposed in the ceramic member, and an electricity supply member which is electrically conductive and is in contact with the heating resistor element and which holds an object on the first surface of the ceramic member. The method comprises the steps of forming a coat layer which is a nitride containing at least one of Al, Ti, Zr, V, Ta, and Nb on at least a portion of a surface of the heating resistor element, excluding its contact surface for contact with the electricity supply member; and forming, through firing, the ceramic member in which the electricity supply member and the heating resistor element having the coat layer formed thereon are disposed. In the present holding device manufacturing method, by virtue of the presence of the coat layer covering the surface of the heating resistor element, it is possible to suppress formation of an altered layer on the surface of the heating resistor element during firing of the ceramic member, which altered layer is formed as a result of the heating resistor element reacting with an impurity (impurities). Thus, it is possible to suppress occurrence of a variation in the amount of heat generated by the heating resistor element due to a variation in the resistance of the heating resistor element. As a result, it is possible to suppress a variation in the temperature of the first surface of the ceramic member (and thus, the temperature of the object held on the first surface). Also, since the coat layer is formed of a nitride containing at least one of Al, Ti, Zr, V, Ta, and Nb, during high temperature firing, the coat layer has heat resistance, and element diffusion into the ceramic member whose main component is aluminum nitride is less likely to occur. Accordingly, in the present holding device manufacturing method, while a change in the characteristics of the ceramic member due to the element diffusion from the coat layer can be suppressed, presence of the coat layer having high heat resistance makes it possible to suppress formation of an altered layer on the surface of the heating resistor element, and thus to suppress a variation in the resistance (heat generation amount) of the heating resistor element. As a result, it is possible to suppress a variation in the temperature of the first surface of the ceramic member (and thus, the temperature of the object held on the first surface).

Notably, the technique disclosed in the present specification can be realized in various aspects. For example, the technique can be realized as a holding device, a heating device, a component for a semiconductor manufacturing apparatus, or a method of manufacturing the device or the component.

BRIEF DESCRIPTION OF DRAWINGS

FIG. 1 is a perspective view schematically showing an external structure of a heating device 100 according to a first embodiment;

FIG. 7 is an explanatory table showing the results of the performance evaluation.

DESCRIPTION OF EMBODIMENTS

A. First Embodiment

A-1. Structure of a Heating Device 100

Figure 2:
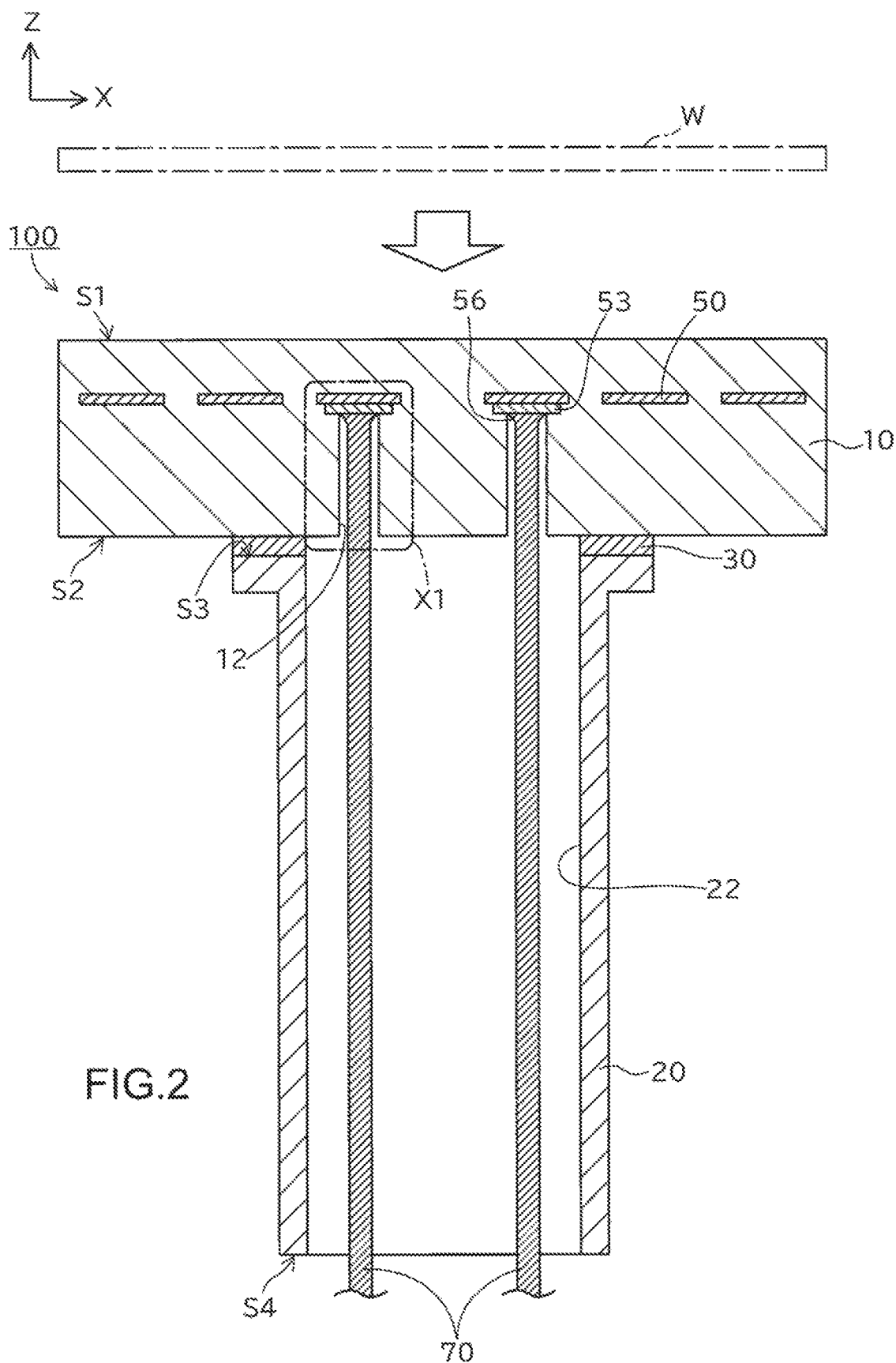
FIG. 2 is an explanatory view schematically showing an XZ cross-sectional structure of the heating device 100 according to the first embodiment.
Figure 3:
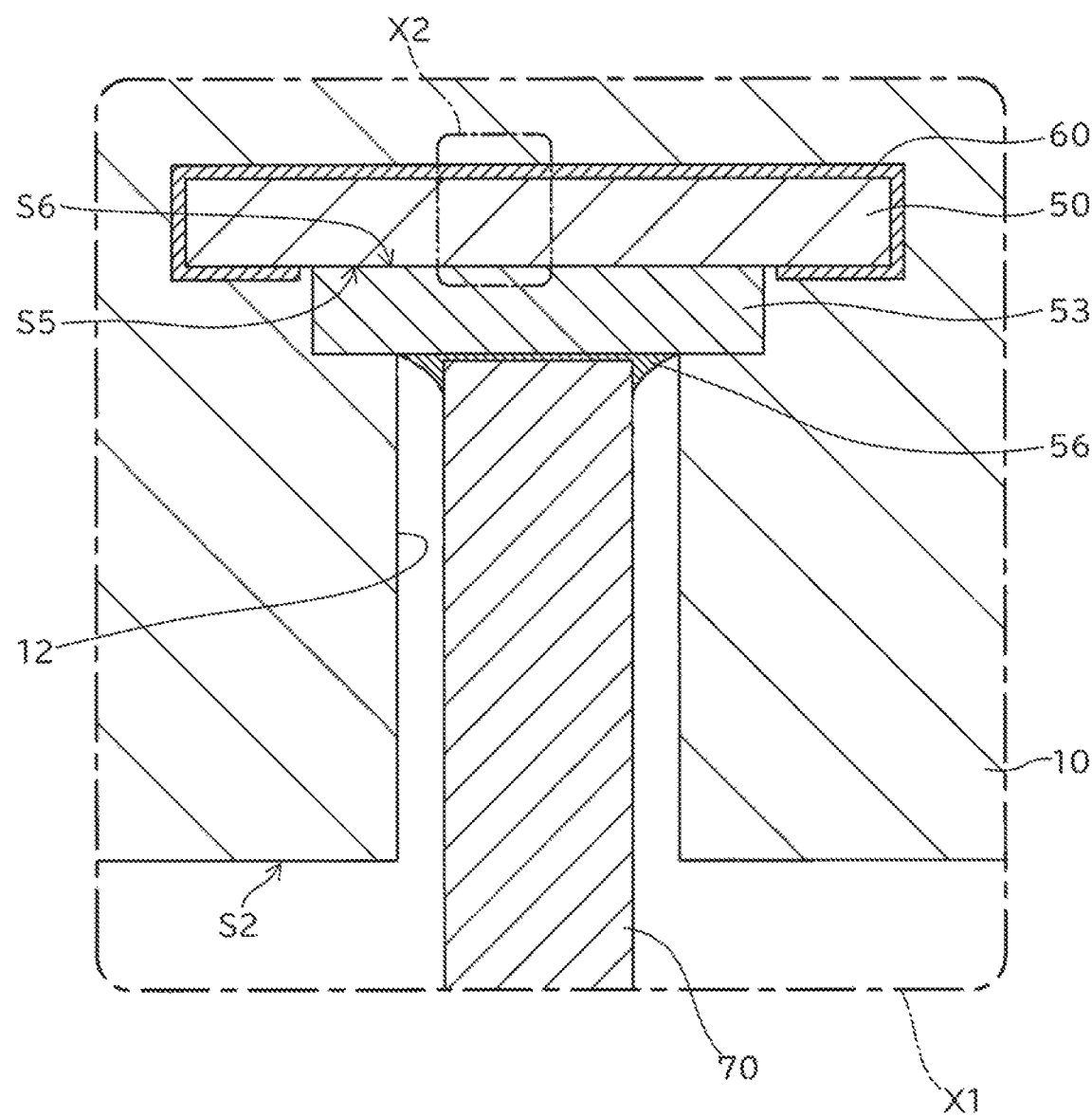
FIG. 3 is an explanatory view showing, on an enlarged scale, the XZ cross-sectional structure of the heating device 100 in a portion X1 of FIG. 2.

FIG. 1 is a perspective view schematically showing an external structure of a heating device 100 according to a first embodiment. FIG. 2 is an explanatory view schematically showing an XZ cross-sectional structure of the heating device 100 according to the first embodiment. FIG. 3 is an explanatory view showing, on an enlarged scale, the XZ cross-sectional structure of the heating device 100 in a portion X1 of FIG. 2. Mutually orthogonal X, Y, and Z axes for specifying directions are shown in these figures. In the present specification, a positive Z-axis direction is referred to as an upward direction, and a negative Z-axis direction is referred to as a downward direction, for the sake of convenience. However, in actuality, the heating device 100 may be disposed with an orientation different from such an orientation.

The heating device 100 is a device for heating an object (for example, a semiconductor wafer W) to a predetermined temperature (for example, about 400 to 800° C.) while holding the object and is also called a "susceptor". The heating device 100 is used, for example, as a component which constitutes a semiconductor manufacturing apparatus such as a film formation apparatus (a CVD film formation apparatus, a sputtering film formation apparatus, etc.) or an etching apparatus (a plasma etching apparatus, etc.). The heating device 100 is an example of the holding device in the claims.

As shown in FIGS. 1 and 2, the heating device 100 includes a holding member 10 and a support member 20.

The holding member 10 is an approximately disc-shaped member having a surface (hereinafter referred to as the "holding surface") S1 approximately perpendicular to the Z-axis direction (the vertical direction) and a surface (hereinafter referred to as the "back surface") S2 on the side opposite the holding surface S1. The holding member 10 is formed of a sintered ceramic material containing aluminum nitride (AlN) as a main component. Notably, in the present specification, the "main component" means a component whose content ratio (weight ratio) is the largest. The diameter of the holding member 10 is, for example, about 100 mm to 500 mm, and the thickness (dimension in the Z-axis direction) of the holding member 10 is, for example, about 3 mm to 30 mm. The holding member 10 is an example of the ceramic member in the claims, the holding surface S1 is an example of the first surface in the claims, and the Z-axis direction is an example of the first direction in the claims.

As shown in FIGS. 2 and 3, a pair of recesses 12 corresponding to a pair of terminal members 70 and a pair of electricity receiving electrodes 53 which will be described later are formed in the back surface S2 of the holding member 10. The shape of a cross section (XY cross section) of each recess 12 perpendicular to the Z-axis direction is, for example, approximately circular.

The support member 20 is a member having an approximately circular tubular shape and extending in the Z-axis direction. The support member 20 is formed of a sintered ceramic material which contains, for example, aluminum nitride or alumina ($Al_2O_3$) as a main component. The outer diameter of the support member 20 is, for example, about 30 mm to 90 mm, and the height (dimension in the Z-axis direction) of the support member 20 is, for example, about 100 mm to 300 mm.

As shown in FIG. 2, the support member 20 has a through hole 22 formed therein and extending in the Z-axis direction from the upper surface S3 of the support member 20 to the lower surface S4 of the support member 20. The shape of a cross section (XY cross section) of the through hole 22 perpendicular to the Z-axis direction is, for example, approximately circular. The inner diameter of the through hole 22 is, for example, about 10 mm to 70 mm.

As shown in FIG. 2, the holding member 10 and the support member 20 are disposed such that the back surface S2 of the holding member 10 and the upper surface S3 of the support member 20 face each other in the Z-axis direction and the holding member 10 and the support member 20 are approximately coaxial with each other. The holding member 10 and the support member 20 are joined to each other via a joining portion 30 formed of a well known joining material.

As shown in FIG. 2, a heating resistor element 50 serving as a heater for heating the holding member 10 is disposed in the holding member 10. The heating resistor element 50 forms, for example, a pattern extending generally spirally as viewed in the Z-axis direction. The heating resistor element 50 is formed of, for example, a metal such as tungsten (W) or molybdenum (Mo). The diameter of the entire heating resistor element 50 as viewed in the Z-axis direction is, for example, about 70 mm to 450 mm. The line width of the heating resistor element 50 as viewed in the Z-axis direction is, for example, about 0.1 mm to 10 mm. The thickness (size in the Z-axis direction) of the heating resistor element 50 is, for example, about 0.1 mm to 3 mm.

As shown in FIGS. 2 and 3, a pair of electricity receiving electrodes 53 are disposed in the holding member 10. Each electricity receiving electrode 53 is a plate member having an approximately circular shape as viewed in the Z-axis direction. Each electricity receiving electrode 53 is formed of, for example, an electrically conductive material such as tungsten or molybdenum and does not contain any organic substance. Notably, a state in which "each electricity receiving electrode 53 does not contain any organic substance" described herein includes a state in which each electricity receiving electrode 53 contains an organic substance (specifically, contains the organic substance in an amount less than 1 wt %) as an impurity. The thickness of each electricity receiving electrode 53 is, for example, about 0.1 mm to 5 mm. In the present embodiment, the electricity receiving electrode 53 is an example of the electricity supply member in the claims.

One of the paired electricity receiving electrodes 53 is exposed to the bottom surface of one of the paired recesses 12 formed in the back surface S2 of the holding member 10 and is in contact, through its upper surface S6, with a lower surface S5 of the heating resistor element 50, which forms a generally spiral pattern, at a position near an one end thereof, so that the one electricity receiving electrode 53 is electrically connected to the heating resistor element 50. Similarly, the other of the paired electricity receiving electrodes 53 is exposed to the bottom surface of the other of the paired recesses 12 formed in the back surface S2 of the holding member 10 and is in contact, through its upper surface S6, with the lower surface S5 of the heating resistor element 50 at a position near the other end thereof, so that the other electricity receiving electrode 53 is electrically connected to the heating resistor element 50.

As shown in FIGS. 2 and 3, a pair of terminal members 70 are disposed in the through hole 22 formed in the support member 20. Each terminal member 70 is, for example, a member having an approximately circular columnar shape. Each terminal member 70 is formed of, for example, an electrically conductive material such as nickel or titanium. The diameter of the terminal members 70 is, for example, about 3 mm to 8 mm.

An upper end portion of one of the paired terminal members 70 is received in one of the paired recesses 12 formed in the back surface S2 of the holding member 10, and is joined, through a brazing portion 56, to the corresponding electricity receiving electrode 53 exposed to the bottom surface of the recess 12. Similarly, an upper end portion of the other of the paired terminal members 70 is received in the other of the paired recesses 12 formed in the back surface S2 of the holding member 10, and is joined, through another brazing portion 56, to the corresponding electricity receiving electrode 53 exposed to the bottom surface of the recess 12. Each of the brazing portions 56 is formed through use of, for example, a metal brazing material such as an Ni alloy (e.g., Ni—Cr-based alloy), an Au alloy (e.g., Au—Ni-based alloy), or pure Au.

The heating device 100 having such a structure operates as follows. When a voltage is applied from an unillustrated power supply to the heating resistor element 50 through the terminal members 70 and the electricity receiving electrodes 53, the heating resistor element 50 generates heat. As a result, the object (for example, the semiconductor wafer W) held on the holding surface S1 of the holding member 10 is heated to a predetermined temperature (for example, about 400 to 800° C.). Notably, in the heating device 100 of the present embodiment, since the terminal members 70 are connected to the heating resistor element 50 through the electricity receiving electrodes 53, stress produced due to the difference in thermal expansion between the terminal members 70 and the heating resistor element 50 can be mitigated.

A-2. Specific Structure of the Heating Resistor Element 50 and its Vicinity

Figure 4:
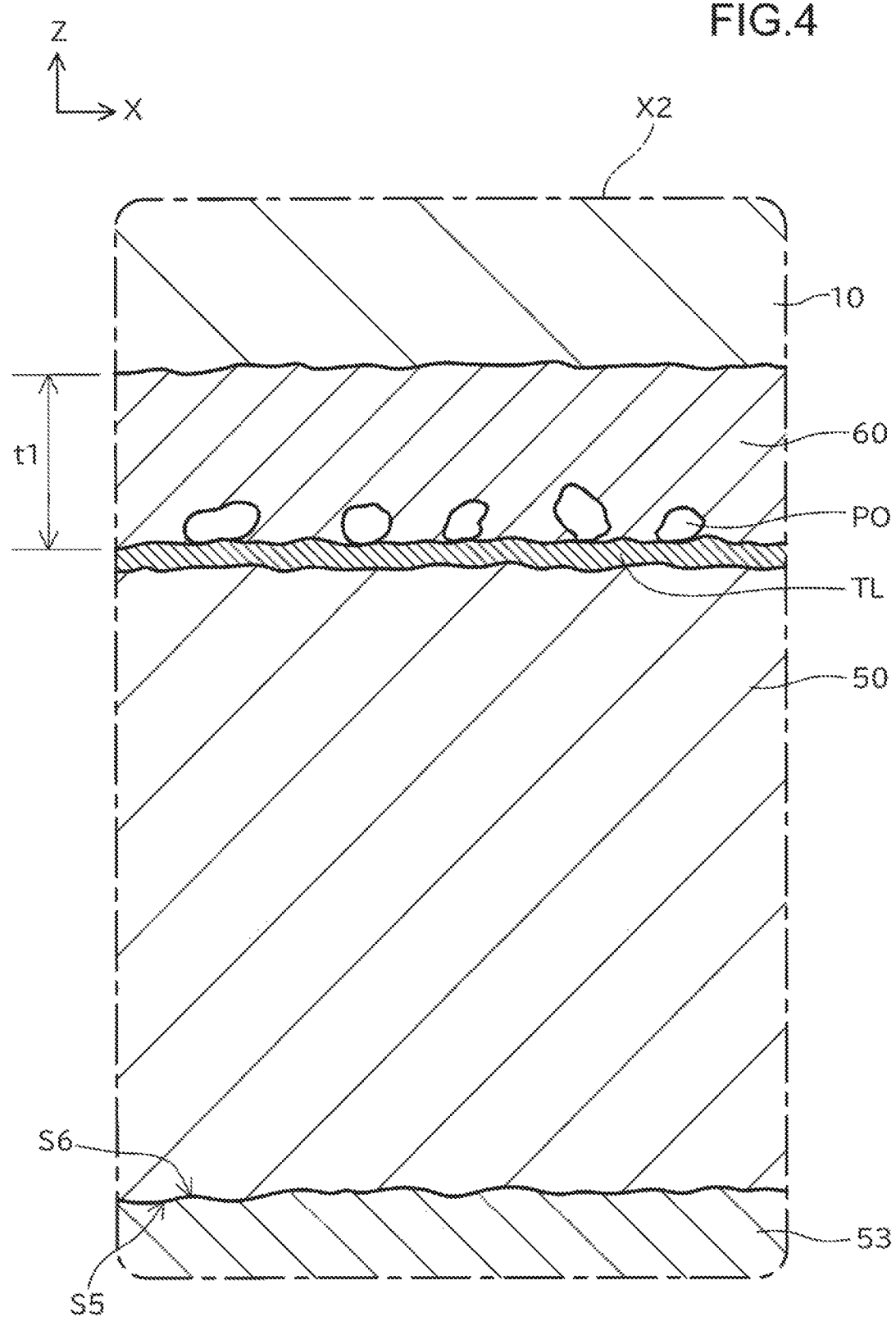
FIG. 4 is an explanatory view showing, on an enlarged scale, the XZ cross-sectional structure of the heating device 100 in a portion X2 of FIG. 3.

Next, the specific structure of the heating resistor element 50 and its vicinity will be described with reference to FIG. 3 and FIG. 4, which is an explanatory view showing, on an enlarged scale, the XZ cross-sectional structure of the heating device 100 in a portion X2 of FIG. 3.

In the heating device 100 of the present embodiment, a coat layer 60 covers at least a portion of the surface of the heating resistor element 50, excluding its contact surfaces for contact with the electricity receiving electrodes 53. More specifically, the coat layer 60 covers the greater part (for example, 80% or greater) of the surface of the heating resistor element 50, excluding its contact surfaces for contact with the electricity receiving electrodes 53.

The coat layer 60 is formed of a nitride containing at least one of Al, Ti, Zr, V, Ta, and Nb. Namely, the coat layer 60 is formed of, for example, AlN, TiN, ZrN, (Al,Ti)N, (Al,Ti,Si)N, (Al,Ti,Cr)N, (Al,Cr)N, VN, TaN, NbN, or the like. The thickness t1 of the coat layer 60 is preferably 0.3 μm to 60 μm. The porosity of the coat layer 60 is preferably 30% or less, more preferably 10% or less.

Notably, the expression "the coat layer 60 covers at least a portion of the surface of the heating resistor element 50, excluding its contact surfaces for contact with the electricity receiving electrodes 53" means that, when attention is paid to the surface of the heating resistor element 50, excluding its contact surfaces for contact with the electricity receiving electrodes 53, a portion or the entirety of the surface is covered by the coat layer 60 and does not exclude an embodiment in which the coat layer 60 covers partially or entirely the contact surfaces of the heating resistor element 50, which are parts of the surface and are for contact with the electricity receiving electrodes 53. Notably, in the case where the coat layer 60 is electrically conductive (for example, in the case where the coat layer 60 is formed of a nitride containing at least one of Ti, Zr, V, Ta, and Nb), the coat layer 60 does not adversely affect the electrical continuity between the heating resistor element 50 and the electricity receiving electrodes 53 even when the coat layer 60 covers partially or entirely the contact surfaces which are parts of the surface of the heating resistor element 50 and are provided for contact with the electricity receiving electrodes 53. However, in the case where the coat layer 60 is not electrically conductive (for example, in the case where the coat layer 60 is formed of AlN), in order to secure the electrical continuity between the heating resistor element 50 and the electricity receiving electrodes 53, it is preferred that the coat layer 60 does not cover at least a portion of the contact surfaces which are parts of the surface of the heating resistor element 50 and are provided for contact with the electricity receiving electrodes 53.

Since element B, C, and O may react with the heating resistor element 50 formed of Mo or W, preferably, the coat layer 60 does not contain element B, C, and O.

In at least one cross section parallel to the Z-axis direction (for example, the XZ cross section shown in FIG. 4), pores PO present at the interface between the heating resistor element 50 and the coat layer 60 preferably have an average diameter of 10 μm or less. However, in the case where the thickness of the coat layer 60 is 10 μm or less, the average diameter of the pores PO is preferably two thirds of the thickness of the coat layer 60 or less.

In at least one cross section parallel to the Z-axis direction (for example, the XZ cross section shown in FIG. 4), the ratio of the sectional area of a carbide layer (for example, a tungsten carbide layer or a molybdenum carbide layer)

which is an altered layer TL formed on the surface of the heating resistor element 50 to the sectional area of the heating resistor element 50 is preferably 10% or less, more preferably, 3% or less. The "cross section" mentioned herein may be any cross section so long as the cross section provides a view of the entirety of the heating resistor element 50 as viewed in the Z-axis direction. The cross section is not required to provide a view of the entirety of the heating resistor element 50 as viewed in a direction perpendicular to the Z-axis direction (for example, the X-axis direction).

A-3. Method of Manufacturing the Heating Device 100

Figure 5:
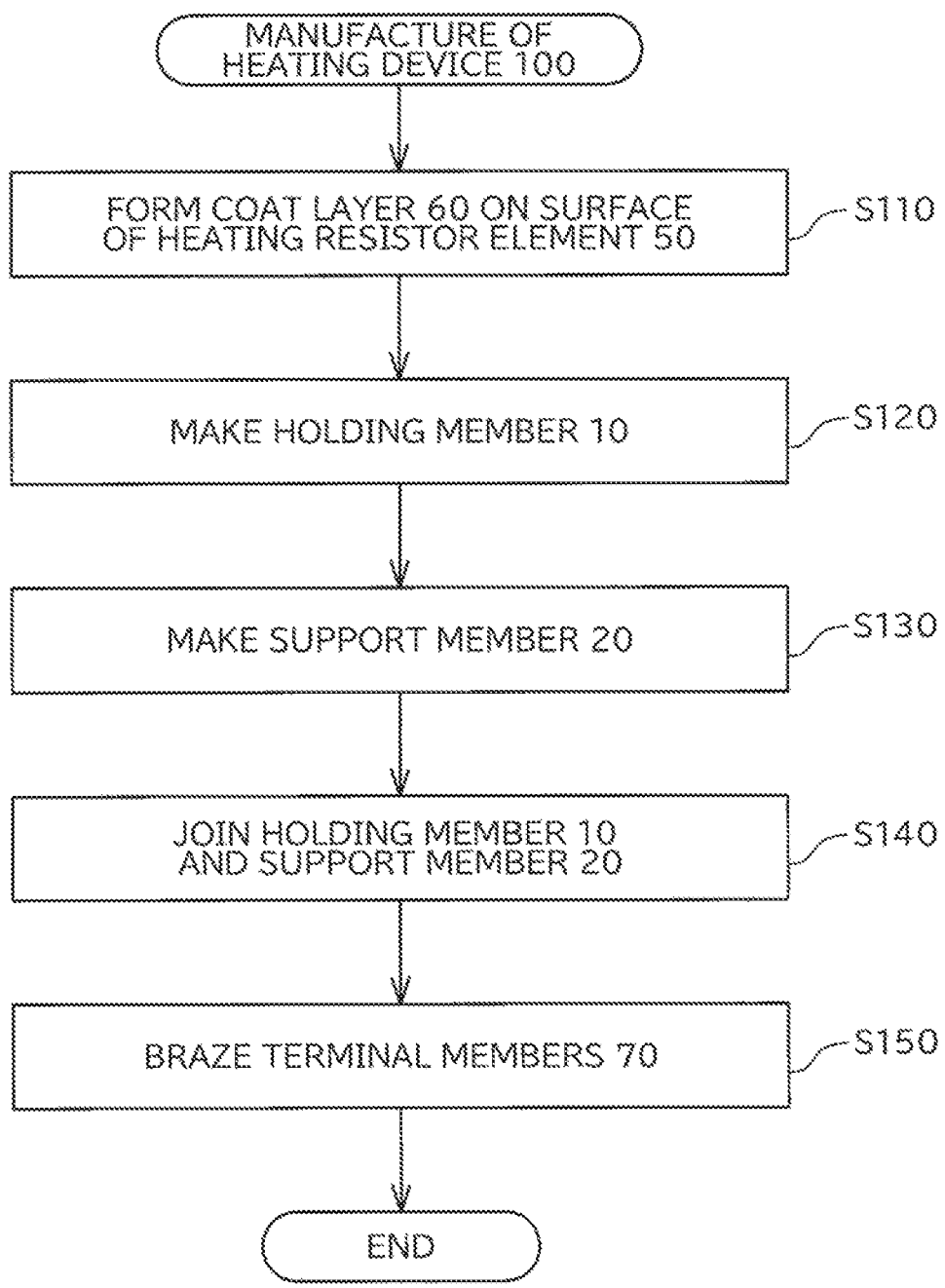
FIG. 5 is a flowchart showing an example of the method of manufacturing the heating device 100 of the first embodiment.

A method of manufacturing the heating device 100 of the present embodiment is, for example, as follows. FIG. 5 is a flowchart showing an example of the method of manufacturing the heating device 100 of the first embodiment. First, the heating resistor element 50 formed of a mesh or foil of a metal (for example, tungsten or molybdenum) is prepared. Subsequently, the coat layer 60, which is a nitride containing at least one of Al, Ti, Zr, V, Ta, and Nb is formed on at least a portion of the surface of the heating resistor element 50, excluding its contact surfaces for contact with the electricity receiving electrodes 53 (in the present embodiment, on the greater part of the surface of the heating resistor element 50, excluding its contact surfaces for contact with the electricity receiving electrodes 53) (S110). Notably, the coat layer 60 is formed, for example, by performing thermal spraying, sputtering, CVD, PVD, or the like while masking the regions of the surface of the heating resistor element 50 where the coat layer 60 is not formed. The diameters of the pores PO present at the interface between the coat layer 60 and the heating resistor element 50 can be adjusted by adjusting the film forming conditions (for example, film forming speed) at that time.

Also, the holding member 10 is made, for example, as follows (S120). Namely, a material powder mixture containing aluminum nitride powder (for example, 95 parts by weight) and an appropriate amount (for example, 5 parts by weight) of optional yttrium oxide powder added thereto is charged into a die and is pressed uniaxially, whereby a first layer of a compact is formed. The heating resistor element 50 having the coat layer 60 formed thereon and the electricity receiving electrodes 53 formed of, for example, a metal plate are disposed on the first layer such that the heating resistor element 50 comes into contact with the electricity receiving electrodes 53. Next, the above-mentioned material powder mixture is charged on the heating resistor element 50 and the electricity receiving electrodes 53 so as to form a second layer of the compact such that the second layer has a predetermined thickness. The compact prepared in the above-described manner is hot-press fired under predetermined conditions (for example, temperature: about 1,700° C. to 1,900° C., pressure: about 1 MPa to 20 MPa, time: about 1 hour to 5 hours), whereby the holding member 10 having the heating resistor element 50 and the electricity receiving electrodes 53 disposed therein is fabricated.

The recesses 12 in the back surface S2 of the holding member 10 are formed by, for example, grinding work performed on the holding member 10 by using a grinding tool after the above-described hot-press firing. This grinding work is performed until the electricity receiving electrodes 53 are exposed. Notably, it is preferred to render the thickness of the electricity receiving electrodes 53 greater than the thickness of the heating resistor element 50, to thereby prevent damage (e.g., cracking) to the electricity receiving electrode 53 even when the electricity receiving electrodes 53 are ground slightly by the grinding tool during the grinding work for formation of the recesses 12.

Also, the support member 20 is made, for example, as follows (S130). A mixture is prepared by adding an appropriate amount (for example, 1 part by weight) of optional yttrium oxide powder, PVA as a binder (for example, 3 parts by weight), a dispersant, and a plasticizer to aluminum nitride powder (for example, 100 parts by weight). An organic solvent such as methanol is added to the mixture, and the resultant mixture is mixed by a ball mill so as to obtain a slurry. This slurry is granulated by a spray drier, whereby a material powder is prepared. This material powder is cold-isostatic pressed under a predetermined pressure (for example, 100 MPa to 250 MPa), whereby a compact is obtained. Notably, the through hole 22 of the support member 20 may be formed by using a rubber die during the molding or may be formed through machining after molding or firing. The obtained compact is debindered in air at, for example, 600° C., and the debindered compact is suspended in an nitrogen gas atmosphere within a furnace and is fired under predetermined conditions (for example, temperature: about 1,800° C. to 1,900° C., time: about 4 hours to 6 hours), whereby the support member 20 is fabricated.

Next, the holding member 10 and the support member 20 are joined together (S140). Namely, a known joining material such as a complex oxide of, for example, an alkaline earth metal, a rare earth element, and aluminum is mixed with an organic solvent or the like to prepare a paste. After lapping the back surface S2 of the holding member 10 and the upper surface S3 of the support member 20 when necessary, the paste is applied uniformly on at least one the back surface S2 of the holding member 10 and the upper surface S3 of the support member 20, and a debindering process is performed. Subsequently, the back surface S2 of the holding member 10 and the upper surface S3 of the support member 20 are mated together, and the assembly of the holding member 10 and the support member 20 is hot-press fired under predetermined conditions (for example, temperature: about 1,400° C. to 1,850° C., pressure: about 0.5 MPa to 10 MPa) in vacuum or a depressurized inert gas (e.g., nitrogen gas or argon gas). As a result, the joining portion 30 for joining the holding member 10 and the support member 20 is formed.

Next, the terminal members 70 are inserted into the through hole 22 of the support member 20, and the upper end portions of the terminal members 70 are brazed to the electricity receiving electrodes 53, whereby the brazing portions 56 are formed (S150). The heating device 100 having the above-described structure is manufactured mainly by the manufacturing method as described above.

A-4. Effects of the Present Embodiment

As described above, the heating device 100 of the present embodiment is a holding device which includes the holding member 10 which has the holding surface S1 approximately perpendicular to the Z-axis direction and is formed of a sintered ceramic material containing aluminum nitride as a main component, the heating resistor element 50 formed of a metal and disposed in the holding member 10, and the electrically conductive electricity receiving electrodes 53 in contact with the heating resistor element 50 and which holds an object such as a semiconductor wafer W on the holding surface S1 of the holding member 10. In the heating device 100 of the present embodiment, at least a portion of the surface of the heating resistor element 50, excluding its contact surfaces for contact with the electricity receiving electrodes 53, is covered with the coat layer 60, which is formed of a nitride containing at least one of Al, Ti, Zr, V, Ta, and Nb.

As described above, during manufacture of the heating device 100 of the present embodiment, the compact of the material of the holding member 10 in which the material of the heating resistor element 50 is disposed is fired at high temperature (for example, about 1,700° C. to 1,900° C.), whereby the holding member 10 formed of a dense sintered ceramic material and the heating resistor element 50 disposed in the holding member 10 are made. During the firing, an impurity (impurities) (for example, carbon) originating from raw materials or the atmosphere within a furnace may enter the compact of the material of the holding member 10 before being densified and react with the heating resistor element 50, thereby forming an altered layer TL (for example, a tungsten carbide layer or a molybdenum carbide layer) on the surface of the heating resistor element 50 (see FIG. 4). If such an altered layer TL is formed on the surface of the heating resistor element 50, a variation (intra-product and/or inter-product variation) in the resistance of the heating resistor element 50 may arise. This may result in occurrence of a variation in the amount of heat generated by the heating resistor element 50 and a variation in the temperature of the holding surface S1 of the holding member 10 (and thus, the temperature of the object (such as the semiconductor wafer W) held on the holding surface S1).

However, in the heating device 100 of the present embodiment, by virtue of the presence of the coat layer 60 covering the surface of the heating resistor element 50, it is possible to suppress formation of the altered layer TL on the surface of the heating resistor element 50 during the firing of the holding member 10, which altered layer TL is formed as a result of the heating resistor element 50 reacting with the an impurity (impurities). Thus, it is possible to suppress occurrence of a variation in the amount of heat generated by the heating resistor element 50 due to a variation in the resistance of the heating resistor element 50. As a result, it is possible to suppress a variation in the temperature of the holding surface S1 of the holding member 10 (and thus, the temperature of the object held on the holding surface S1). Also, since the coat layer 60 is formed of a nitride containing at least one of Al, Ti, Zr, V, Ta, and Nb, during high temperature firing, the coat layer 60 has heat resistance, and element diffusion into the holding member 10 whose main component is aluminum nitride is less likely to occur. Accordingly, in the heating device 100 of the present embodiment, while a change in the characteristics of the holding member 10 due to the element diffusion from the coat layer 60 can be suppressed, presence of the coat layer 60 having high heat resistance makes it possible to suppress formation of the altered layer TL on the surface of the heating resistor element 50, and thus to suppress a variation in the resistance (heat generation amount) of the heating resistor element 50. As a result, it is possible to suppress a variation in the temperature of the holding surface S1 of the holding member 10 (and thus, the temperature of the object held on the holding surface S1).

Notably, in the case where the coat layer 60 is electrically conductive (for example, in the case where the coat layer 60 is formed of a nitride containing at least one of Ti, Zr, V, Ta, and Nb), it is unnecessary to perform a special process (for example, a process of masking regions where electrical continuity must be secured (for example, contact surfaces which are parts of the surface of the heating resistor element 50 and are provided for contact with the electricity receiving electrodes 53) when the coat layer 60 is formed on the surface of the heating resistor element 50. Therefore, it is possible to simplify the manufacturing process and reduce costs. In the case where the coat layer 60 is formed of AlN, the difference in thermal expansion between the coat layer 60 and the holding member 10 and the difference in thermal expansion between the coat layer 60 and the heating resistor element 50 become relatively small. Therefore, occurrence of cracking of the coat layer 60 can be prevented even when the thickness of the coat layer 60 is made relatively large.

Also, in the heating device 100 of the present embodiment, the electricity receiving electrodes 53 are formed of, for example, an electrical conductive material such as tungsten or molybdenum and does not contain any organic substance. Namely, in the heating device 100 of the present embodiment, the heating resistor element 50 is connected to members for electricity supply (the electricity receiving electrodes 53 and the terminal members 70) without intervention of a member containing an organic substance(s) (for example, a connection member containing a metal and an organic substance as a binder). Therefore, according to the heating device 100 of the present embodiment, it is possible to suppress formation of the altered layer TL on the surface of the heating resistor element 50 due to reaction of the heating resistor element 50 with the organic substance(s). Notably, the heating resistor element 50 is formed of, for example, a metal foil, a metal plate, a metal mesh, or a metal coil. In the case where the heating resistor element 50 is formed of a material whose surface has a relatively small undulation, such as a metal foil or a metal plate, it is possible to easily realize a structure in which the heating resistor element 50 is connected to the members for electricity supply without intervention of a member containing an organic substance(s). Meanwhile, in the case where the heating resistor element 50 is formed of a material whose surface has a relatively large undulation, such as a metal mesh or a metal coil, it is possible to enhance the adhesion between the heating resistor element 50 and the holding member 10.

Notably, the thickness t1 of the coat layer 60 is preferably 0.3 µm to 60 µm. When such a configuration is employed, the thickness of the coat layer 60 is not excessively small (0.3 µm or greater). Therefore, by virtue of presence of the coat layer 60, it is possible to more reliably suppress formation of the altered layer TL on the surface of the heating resistor element 50. Also, when such a configuration is employed, since the thickness of the coat layer 60 is not excessively large (60 µm or less), it is possible to reduce the stress which is produced in the coat layer 60 due to the difference in linear expansion between the heating resistor element 50 and the coat layer 60. As a result, it is possible to prevent occurrence of a situation in which a crack is developed in the coat layer 60 due to the stress and formation of the altered layer TL cannot be suppressed.

Also, in at least one cross section parallel to the Z-axis direction (for example, the XZ cross section shown in FIG. 4), the pores PO present at the interface between the heating resistor element 50 and the coat layer 60 preferably have an average diameter of 10 µm or less. When such a configuration is employed, the diameters of the pores PO present at the interface between the heating resistor element 50 and the coat layer 60 are relatively small. Therefore, it is possible to suppress invasion of an impurity (impurities) through the pores PO present at the interface, thereby more reliably suppressing formation of the altered layer TL on the surface of the heating resistor element 50. Also, when such a configuration is employed, since the diameters of the pores PO present at the interface between the heating resistor element 50 and the coat layer 60 are relatively small, it is possible to suppress crushing of the pores PO and resultant development of a crack in the coat layer 60 when pressing force is applied to the heating resistor element 50 and the coat layer 60, for example, at the time of hot press firing. This also contributes to more reliable suppression of formation of the altered layer TL on the surface of the heating resistor element 50.

Also, in at least one cross section parallel to the Z-axis direction (for example, the XZ cross section shown in FIG. 4), the ratio of the sectional area of the carbide layer (the altered layer TL) formed on the surface of the heating resistor element 50 to the sectional area of the heating resistor element 50 is preferably 10% or less. When such a configuration is employed, the amount of the carbide layer (altered layer TL) formed on the surface of the heating resistor element 50 is small. Therefore, it is possible to realize the heating device 100 which exhibits a smaller variation in the resistance (heat generation amount) of the heating resistor element 50. Also, in at least one cross section parallel to the Z-axis direction (for example, the XZ cross section shown in FIG. 4), the ratio of the sectional area of the carbide layer (the altered layer TL) formed on the surface of the heating resistor element 50 to the sectional area of the heating resistor element 50 is more preferably 3% or less. When such a configuration is employed, the amount of the carbide layer (altered layer TL) formed on the surface of the heating resistor element 50 is smaller. Therefore, it is possible to realize the heating device 100 which exhibits a smaller variation in the resistance (heat generation amount) of the heating resistor element 50.

A-5. Method of Analyzing the Heating Device 100

A-5-1. Method of Determining the Thickness t1 of the Coat Layer 60:

A method of determining the thickness t1 of the coat layer 60 formed on the surface of the heating resistor element 50 is as follows.

(Case where the Coat Layer 60 Contains an Element(s) Other than Al)

After a cross section containing the heating resistor element 50 (cross section parallel to the Z-axis direction) is mirror-polished, the mirror-polished cross section is subjected to a cross section polisher treatment for treating a cross section of a sample by means of an ion beam (e.g., argon ion beam). Next, the treated cross section is photographed and observed in 10 fields of view by using an electron probe micro analyzer (EPMA). Notably, the field of elemental mapping is 100 μm×100 μm. Next, by using an image analysis software program (Analysis Five which is a product of Soft Imaging System GmbH), the position of the interface between the heating resistor element 50 and the coat layer 60 and the position of the interface between the holding member 10 and the coat layer 60 are confirmed and lines are drawn therealong. In each of view images, the shortest distance between the lines drawn along the two interfaces is determined as the thickness t1 of the coat layer 60. The average of the thicknesses t1 of the coat layer 60 determined in the 10 view images is finally employed as the thickness t1 of the coat layer 60.

(Case where the Coat Layer 60 is Formed of AlN (i.e., Case where the Coat Layer 60 is Formed of the Same Material as the Holding Member 10))

After a cross section containing the heating resistor element 50 (cross section parallel to the Z-axis direction) is mirror-polished, the mirror-polished cross section is subjected to a cross section polisher treatment for treating a cross section of a sample by means of an ion beam (e.g., argon ion beam). Next, the treated cross section is photographed and observed in a designated field of view by using a scanning electron microscope (SEM). Notably, the treated cross section is photographed in the following two types of fields of view; i.e., 10 fields of view of a first type and 10 fields of view of a second type.

(1) Fields of view having a size of 100 μm×100 μm and including the interface between the heating resistor element 50 and the holding member 10

(2) Fields of view having a size of 1 mm×1 mm and including the interface between the heating resistor element 50 and the holding member 10

When the following two requirements are satisfied, the heating resistor element 50 is judged to be covered with the coat layer 60 of AlN.

Requirement 1: when the diameters of pores at the interface between the heating resistor element 50 and the holding member 10 and the number of the pores are determined, through observation, in each of the 10 view images of the above-mentioned fields of view (1), the number of pores whose diameters are 0.5 μm to 3 μm is two or more on average, and diffusion of an element of a component(s) not contained in the holding member 10 and the heating resistor element 50 is not observed.

Requirement 2: when the distribution of the grain boundary phase component in the above-mentioned fields of view (2) is observed, of the 10 view images, at least 5 view images do not include a region where the grain boundary phase component is contained in a small amount in the vicinity of the interface between the heating resistor element 50 and the holding member 10 (within a 100 μm range from the interface).

Usually, an oxide present on the surface of a member made of a metal such as W or Mo (hereinafter referred to as "metal surface oxide") and an oxide present on the surface of each AlN grain form a liquid phase at low temperature and lead to densification. Therefore, pores are less likely to be formed at the interface. Also, when sintering proceeds, the grain boundary phase component of AlN is discharged to an unsintered region. Therefore, a difference in the concentration of the grain boundary phase component is produced. Meanwhile, in the case where the coat layer 60 formed of AlN is present on the surface, since the liquid-phase forming reaction at low temperature caused by the reaction between the metal surface oxide and the oxide on the surface of each AlN grain of the holding member 10 does not occur, the interface pores are likely to remain. Also, since a difference in sintering behavior is less likely to be produced between the vicinity of the interface and other locations, the difference in the density of the grain boundary phase component is less likely to be produced. Therefore, when the above-described two requirements are satisfied, it is possible to judge that the heating resistor element 50 is covered with the coat layer 60 of AlN.

Also, in the case where the heating resistor element 50 is judged to be covered with the coat layer 60 of AlN, the thickness t1 of the coat layer 60 is determined as follows. Namely, in the case where the thickness t1 of the coat layer 60 is less than 10 μm, backscattered electron images each having a size of 30 μm×30 μm and including the heating resistor element 50 and the holding member 10 are captured in 10 fields of view. Also, in the case where the thickness t1 of the coat layer 60 is 10 μm or greater, backscattered electron images each having a size of 100 μm×100 μm and including the heating resistor element 50 and the holding member 10 are captured in 10 fields of view. In either case, in each field of view, straight lines parallel to each other are drawn along the interface between the heating resistor element 50 and the AlN portion (the holding member 10+the coat layer 60) and the boundary between a region of the AlN portion where the amount of the grain boundary phase component is large and a region of the AlN portion where the amount of the grain boundary phase component is small. Notably, whereas the coat layer 60 constituting the AlN portion contains no aid, the holding member 10 constituting the AlN portion contains a sintering aid. Therefore, the interface between the holding member 10 and the coat layer 60 can be determined on the basis of the varying concentration of the grain boundary phase component in the AlN portion. In each of view images, the distance between the above-mentioned two straight lines parallel to each other is determined as the thickness t1 of the coat layer 60. The average of the thicknesses t1 of the coat layer 60 determined in the 10 view images is finally employed as the thickness t1 of the coat layer 60.

A-5-2. Method of Determining the Average Diameter of Pores PO Present at the Interface Between the Heating Resistor Element 50 and the Coat Layer 60:

A method of determining the average diameter of pores PO present at the interface between the heating resistor element 50 and the coat layer 60 is as follows. First, images of 10 fields of view are obtained in the same manner as the method of determining the thickness t1 of the coat layer 60 (the case where the coat layer 60 contains an element(s) other than Al), and the average diameter of pores PO in each image is measured. The measurement of the average diameter of pores PO in each image is performed in accordance with a method (intercept method) described in "pages 192 to 195 of "Ceramic Processing" written by Nobuyasu Mizutani, Yoshiharu Ozaki, Toshio Kimura, and Takashi Yamaguch and published by GIHODO SHUPPAN Co., Ltd. on Mar. 25, 1985. Specifically, in each view image, a plurality of straight lines approximately parallel to the interface between the heating resistor element 50 and the coat layer 60 are drawn, the lengths of pores PO located on each straight line are measured, and the average of the lengths is used as the average diameter of the pores PO. The average of the average diameters of the pores PO determined in the 10 view images is finally employed as the average diameter of the pores PO.

A-5-3. Method of Determining the Ratio of the Sectional Area of the Altered Layer TL (Carbide Layer) Formed on the Surface of the Heating Resistor Element 50 to the Sectional Area of the Heating Resistor Element 50:

A method of determining the ratio of the sectional area of the altered layer TL (carbide layer) formed on the surface of the heating resistor element 50 to the sectional area of the heating resistor element 50 is as follows. First, after a cross section (cross section parallel to the Z-axis direction) containing the entirety of the heating resistor element 50 as viewed in the thickness direction thereof is mirror-polished, the mirror-polished cross section is subjected to a cross section polisher treatment for treating a cross section of a sample by means of an ion beam (e.g., argon ion beam). Next, the treated cross section is photographed and observed in 10 fields of view by using an electron probe micro analyzer (EPMA). Notably, the field of elemental mapping is 200 μm×200 μm. Next, by using an image analysis software program (Analysis Five which is a product of Soft Imaging System GmbH), the position of the interface of the altered layer TL is confirmed and a line is drawn therealong. In each of view images, the average thickness of the altered layer TL is obtained, and the value of (the average thickness of the altered layer TL*/the thickness of the heating resistor element 50)×100(%) is determined as the above-described sectional area ratio. The average of the sectional area ratios determined in the 10 view images is finally employed as the sectional area ratio.

B. Second Embodiment

Figure 6:
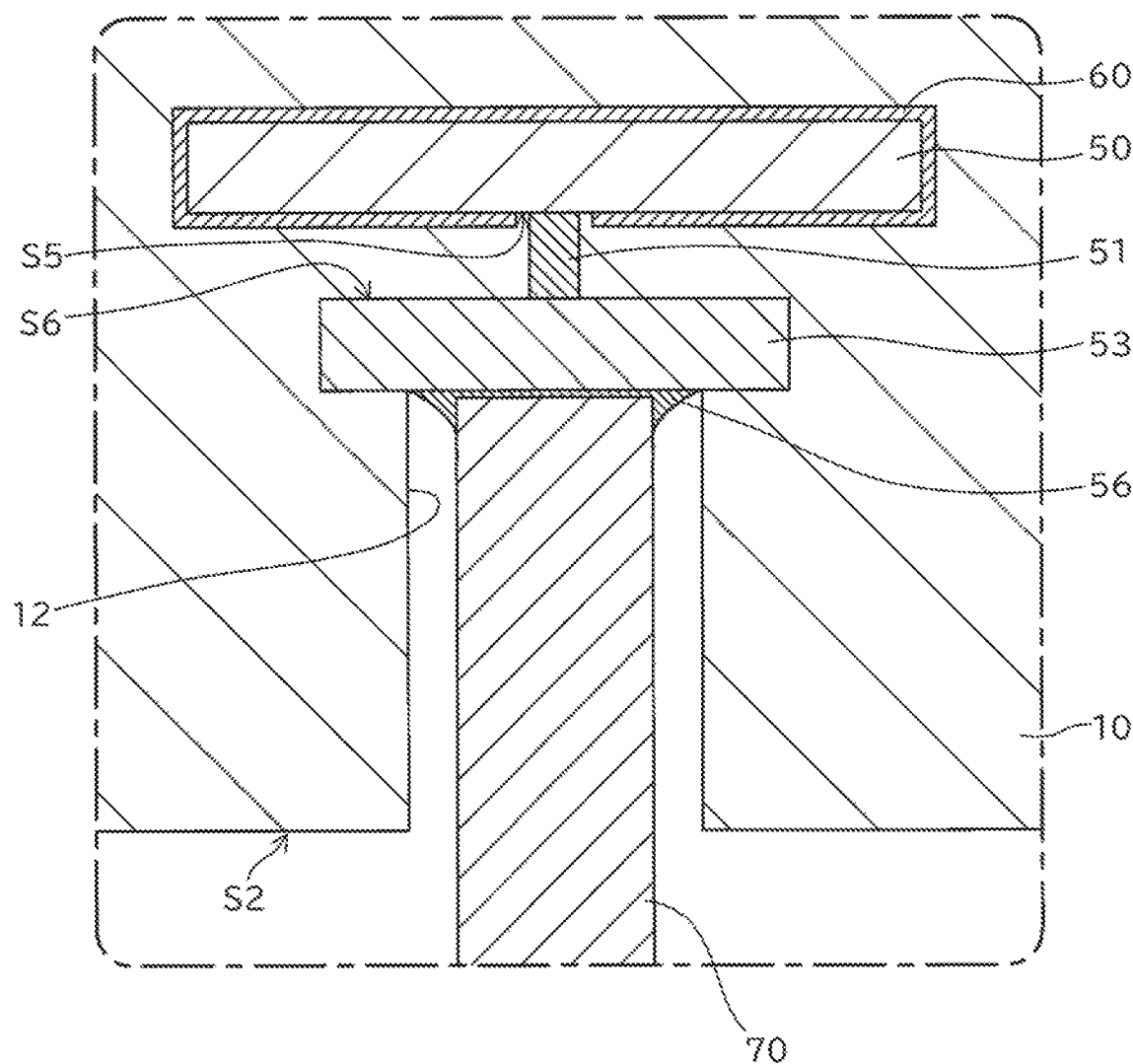
FIG. 6 is an explanatory view showing, on an enlarged scale, the XZ cross-sectional structure of a portion of a heating device 100 of a second embodiment.

FIG. 6 is an explanatory view showing, on an enlarged scale, the XZ cross-sectional structure of a portion (corresponding to the portion X1 of FIG. 2) of a heating device 100 of a second embodiment. In the following description, of the structural components of the heating device 100 of the second embodiment, components identical with those of the above-described heating device 100 of the first embodiment are denoted by the same reference numerals and their descriptions will be omitted.

As shown in FIG. 6, the heating device 100 of the second embodiment differs from the heating device 100 of the first embodiment in that the heating resistor element 50 is not in direct contact with each electricity receiving electrode 53 but is electrically connected to each electricity receiving electrode 53 via a connection member 51. The connection member 51 is a member which is in contact with both the heating resistor element 50 and the electricity receiving electrode 53 in order to electrically connect them. The connection member 51 is formed of an electrically conductive material such as tungsten or molybdenum. In the present embodiment, the connection member 51 is an example of the electricity supply member in the claims.

In the heating device 100 of the second embodiment, the surface of the heating resistor element 50 is covered with the coat layer 60 as in the case of the heating device 100 of the first embodiment. Namely, the coat layer 60 covers at least a portion of the surface of the heating resistor element 50, excluding its contact surface for contact with the connection member 51. More specifically, the coat layer 60 covers the greater part (for example, 80% or greater) of the surface of the heating resistor element 50, excluding its contact surface for contact with the connection member 51.

Notably, the thickness and the forming material of the coat layer 60, the diameters of pores PO present at the interface between the heating resistor element 50 and the coat layer 60, the state of formation of the altered layer TL on the surface of the heating resistor element 50, etc. in the heating device 100 of the second embodiment are the same as those in the heating device 100 of the first embodiment.

Also, the heating device 100 of the second embodiment can be manufactured by a method obtained by modifying the above-described method of manufacturing the heating device 100 of the first embodiment in such a manner that a material (for example, a metal paste containing a metal and an organic substance as a binder) used to form the connection member 51 is disposed between the heating resistor element 50 and each electricity receiving electrode 53 which are sandwiched between layers of the material powder mixture which is the material used for forming the holding member 10, and the resultant compact is subjected to hot press firing.

As described above, the heating device 100 of the second embodiment is a holding device which includes the holding member 10 having the holding surface S1 approximately perpendicular to the Z-axis direction and formed of a sintered ceramic material containing aluminum nitride as a main component, the heating resistor element 50 formed of a metal and disposed in the holding member 10, and the electrically conductive connection member 51 in contact with the heating resistor element 50 and which holds an object such as a semiconductor wafer W on the holding surface S1 of the holding member 10. In the heating device 100 of the second embodiment, at least a portion of the surface of the heating resistor element 50, excluding its contact surface for contact with the connection member 51, is covered with the coat layer 60, which is formed of a nitride containing at least one of Al, Ti, Zr, V, Ta, and Nb. Therefore, in the heating device 100 of the second embodiment, by virtue of the presence of the coat layer 60 covering the surface of the heating resistor element 50, it is possible to prevent formation of the altered layer TL on the surface of the heating resistor element 50 during the firing of the holding member 10, which altered layer TL is formed as a result of the heating resistor element 50 reacting with an impurity (impurities). Thus, it is possible to suppress occurrence of a variation in the amount of heat generated by the heating resistor element 50 due to a variation in the resistance of the heating resistor element 50. As a result, it is possible to suppress a variation in the temperature of the holding surface S1 of the holding member 10 (and thus, the temperature of the object held on the holding surface S1). Also, since the coat layer 60 is formed of a nitride containing at least one of Al, Ti, Zr, V, Ta, and Nb, during high temperature firing, the coat layer 60 has heat resistance, and element diffusion into the holding member 10 whose main component is aluminum nitride is less likely to occur. Accordingly, in the heating device 100 of the second embodiment, while a change in the characteristics of the holding member 10 due to the element diffusion from the coat layer 60 can be suppressed, presence of the coat layer 60 having high heat resistance makes it possible to suppress formation of the altered layer TL on the surface of the heating resistor element 50, and thus to suppress a variation in the resistance (heat generation amount) of the heating resistor element 50. As a result, it is possible to suppress a variation in the temperature of the holding surface S1 of the holding member 10 (and thus, the temperature of the object held on the holding surface S1).

C. Performance Evaluation

Performance evaluation was performed in terms of suppression of a variation in the resistance of the heating resistor element 50 through employment of the above-described structures of the heating devices 100. The performance evaluation will now be described. FIG. 7 is an explanatory table showing the results of the performance evaluation.

As shown in FIG. 7, 25 samples (SA1 to SA25) of the heating device were used for the performance evaluation. Each sample was manufactured by a manufacturing method according to the methods of manufacturing the heating devices 100 of the above-described embodiments. The samples differ from one another in terms of the material and shape of the heating resistor element 50, the form of connection between the heating resistor element 50 and each electricity receiving electrode 53, the material and thickness t1 of the coat layer 60, and the average diameter of pores PO present at the interface between the heating resistor element 50 and the coat layer 60.

Specifically, in samples SA1 to SA16 and SA21 to SA25, a mesh (wire diameter: 0.1 mm, opening: 50 mesh) was used as the heating resistor element 50, and in samples SA17 to SA20, foil (thickness: 0.2 mm) was used as the heating resistor element 50. Also, in samples SA1 to SA16 and SA21 to SA25, the heating resistor element 50 and each electricity receiving electrode 53 were connected through the connection member 51 as in the case of the second embodiment, and in samples SA17 to SA20, the heating resistor element 50 was connected directly to the electricity receiving electrodes 53 without intervention of the connection member 51 as in the case of the first embodiment. Also, in samples SA1 to SA20, the coat layer 60 was formed on the surface of the heating resistor element 50, and in samples SA21 to SA25, the coat layer 60 was not formed on the surface of the heating resistor element 50. Notably, as shown in FIG. 7, in samples SA1 to SA20, a nitride containing at least one of Al, Ti, Zr, V, Ta, and Nb was used to form the coat layer 60.

Also, for each sample, a variation in the resistance of the heating resistor element 50 (n=20) was obtained as part of the performance evaluation. Also, for each sample, the ratio of the sectional area of the altered layer (carbide layer) TL to the sectional area of the heating resistor element 50 in a cross section parallel to the Z-axis direction was measured.

Furthermore, for each sample, a variation in the temperature of the holding surface S1 of the holding member 10 was measured as part of the performance evaluation. More specifically, a blackened dummy wafer was placed on the holding surface S1 of the holding member 10 of each heating device sample, the temperature of the heating device sample was increased by supplying electric power to the heating resistor element 50 through the terminal members 70, and the surface temperature of the dummy wafer was measured. After the electric power supplied through the terminal members 70 was maintained at the same level for 15 minutes from a point when the surface temperature of the dummy wafer had reached 500° C., the maximum temperature difference within the dummy wafer was measured as the temperature variation of the holding surface S1. In FIG. 7, "A" represents that the temperature variation was 5° C. or less, "B" represents that the temperature variation was greater than 5° C. and not greater than 10° C., and "X" represents that the temperature variation was greater than 10° C.

As shown in FIG. 7, in the case of samples SA21 to SA25 in which the coat layer 60 was not formed on the surface of the heating resistor element 50, the variation in the resistance of the heating resistor element 50 was 49% or greater, which is relatively large. Also, in the case of these samples, the temperature variation (temperature difference) of the holding surface S1 was greater than 10° C., which is relatively large. In these samples, since the coat layer 60 was not present on the surface of the heating resistor element 50, during the firing of the holding member 10, conceivably, an impurity (impurities) originating from raw materials or the atmosphere within a furnace entered the compact of the material of the holding member 10 before being densified and reacted with the heating resistor element 50, with resultant formation of a relatively thick altered layer TL on the surface of the heating resistor element 50. As a result, conceivably, a connection failure occurred between the heating resistor element 50 and the electricity receiving electrodes 53, and a variation in the amount of heat generated by the heating resistor element 50 due to a variation in the resistance of the heating resistor element 50 occurred, whereby a variation in the temperature of the holding surface S1 occurred. In actuality, in these samples, the ratio of the sectional area of the altered layer (carbide layer) TL to the sectional area of the heating resistor element 50 in a cross section parallel to the Z-axis direction was 19% or greater, which is relatively large.

In contrast, in the case of samples SA1 to SA20 in which the coat layer 60 was formed on the surface of the heating resistor element 50, the variation in the resistance of the heating resistor element 50 was 21% or less, which is relatively small. Also, in the case of these samples, the temperature variation (temperature difference) of the holding surface S1 was 10° C. or less, which is relatively small. In these samples, conceivably, the presence of the coat layer 60 on the surface of the heating resistor element 50 suppressed formation of the altered layer TL on the surface of the heating resistor element 50 during the firing of the holding member 10, the altered layer TL being formed as a result of the heating resistor element 50 reacting with an impurity (impurities). As a result, conceivably, occurrence of a connection failure between the heating resistor element 50 and the electricity receiving electrodes 53 and occurrence of a variation in the amount of heat generated by the heating resistor element 50 due to a variation in the resistance of the heating resistor element 50 were suppressed. In actuality, in these samples, the ratio of the sectional area of the altered layer (carbide layer) TL to the sectional area of the heating resistor element 50 in a cross section parallel to the Z-axis direction was 10% or less, which is relatively small.

The following was confirmed from the results of this performance evaluation. In the case where at least a portion of the surface of the heating resistor element 50, excluding its contact surfaces for contact with the electricity receiving electrodes 53 or the connection members 51, is covered with the coat layer 60 formed of a nitride containing at least one of Al, Ti, Zr, V, Ta, and Nb, formation of the altered layer TL on the surface of the heating resistor element 50 can be suppressed. As a result, it is possible to suppress a variation in the resistance of the heating resistor element 50, thereby suppressing a variation in the temperature of the holding surface S1 of the holding member 10.

Notably, of samples SA1 to SA20 in which the coat layer 60 was formed on the surface of the heating resistor element 50, samples SA1 and SA3 in which the thickness t1 of the coat layer 60 was less than 0.3 μm and samples SA2 and SA4 in which the thickness t1 of the coat layer 60 was greater than 60 μm each exhibited a variation of 19% or greater in the resistance of the heating resistor element 50. Meanwhile, samples SA5 to SA20 in which the thickness t1 of the coat layer 60 was 0.3 μm to 60 μm each exhibited a variation of 16% or less in the resistance of the heating resistor element 50, which is a better result. In the case of samples SA5 to SA20, since the thickness t1 of the coat layer 60 is not excessively small (0.3 μm or greater), formation of the altered layer TL on the surface of the heating resistor element 50 can be suppressed more reliably by the coat layer 60 present on the surface of the heating resistor element 50. Also, since the thickness t1 of the coat layer 60 is not excessively large (60 μm or less), conceivably, it is possible to reduce the stress which is produced in the coat layer 60 due to the difference in linear expansion between the heating resistor element 50 and the coat layer 60, thereby preventing occurrence of a situation in which a crack is developed in the coat layer 60 due to the stress and formation of the altered layer TL cannot be suppressed. It was confirmed from the results of this performance evaluation that the thickness t1 of the coat layer 60 is preferably 0.3 μm to 60 μm.

Also, of samples SA1 to SA20 in which the coat layer 60 was formed on the surface of the heating resistor element 50, samples SA1 to SA9 in which the average diameter of pores PO present at the interface between the heating resistor element 50 and the coat layer 60 was greater than 10 μm each exhibited a variation of 13% or greater in the resistance of the heating resistor element 50. Meanwhile, samples SA10 to SA20 in which the average diameter of pores PO present at the interface between the heating resistor element 50 and the coat layer 60 was 10 μm or less each exhibited a variation of 9% or less in the resistance of the heating resistor element 50, which is a better result. In the case of samples SA10 to SA20, conceivably, since the diameters of pores PO present at the interface between the heating resistor element 50 and the coat layer 60 were relatively small, it was possible to suppress invasion of an impurity (impurities) through the pores PO present at the interface, thereby more reliably suppressing formation of the altered layer TL on the surface of the heating resistor element 50. Also, in the case of samples SA10 to SA20, conceivably, since the diameters of pores PO present at the interface between the heating resistor element 50 and the coat layer 60 were relatively small, it was possible to suppress crushing of the pores PO and resultant development of a crack in the coat layer 60 when pressing force was applied to the heating resistor element 50 and the coat layer 60, for example, at the time of hot press firing. Conceivably, this also contributed to more reliable suppression of formation of the altered layer TL on the surface of the heating resistor element 50. It was confirmed from the results of this performance evaluation that the average diameter of pores PO present at the interface between the heating resistor element 50 and the coat layer 60 is preferably 10 μm or less in a cross section parallel to the Z-axis direction.

Also, of samples SA1 to SA20 in which the coat layer 60 was formed on the surface of the heating resistor element 50, samples SA1 to SA16 in which the heating resistor element 50 was connected to the electricity receiving electrodes 53 through the connection members 51 each exhibited a variation of 3% or greater in the resistance of the heating resistor element 50. Meanwhile, samples SA17 to SA20 in which the heating resistor element 50 was connected directly to the electricity receiving electrodes 53 without intervention of the connection members 51 each exhibited a variation of 2% or less in the resistance of the heating resistor element 50, which is a better result. In the case of samples SA17 to SA20, conceivably, since the heating resistor element 50 is connected to the members for electricity supply (the electricity receiving members 53 and the terminal members 70) without intervention of a member containing an organic substance (for example, the connection members 51 containing a metal and an organic substance as a binder), formation of the altered layer TL on the surface of the heating resistor element 50 as a result of reaction of the heating resistor element 50 with an organic substance(s) was suppressed more effectively. It was confirmed from the results of this performance evaluation that the heating resistor element 50 is preferably connected to the members for electricity supply (the electricity receiving members 53 and the terminal members 70) without intervention of a member containing an organic substance (for example, the connection members 51 containing a metal and an organic substance as a binder).

Also, as shown in FIG. 7, the ratio of the sectional area of the altered layer (carbide layer) TL to the sectional area of the heating resistor element 50 in a cross section parallel to the Z-axis direction correlates with the variation in the resistance of the heating resistor element 50. When the ratio was 10% or less, the variation in the resistance of the heating resistor element 50 was 21% or less, which is good. When the ratio was 3% or less, the variation in the resistance of the heating resistor element 50 was 4% or less, which is better. It was confirmed from the results of this performance evaluation that the ratio of the sectional area of the altered layer (carbide layer) TL to the sectional area of the heating resistor element 50 in a cross section parallel to the Z-axis direction is preferably 10% or less, more preferably, 3% or less.

D. Modifications

The technique disclosed in the present specification is not limited to the above-described embodiments, and can be implemented in various forms without departing from its gist. For example, the following modifications are possible.

The structures of the heating devices 100 in the above-described embodiments are mere examples and can be modified in various ways. For example, in the above-described first embodiment, the heating resistor element 50 is electrically connected to the terminal members 70 through the electricity receiving electrodes 53. However, the electricity receiving electrodes 53 may be omitted. In this case, the heating resistor element 50 may be in direct contact with the terminal members 70 for electrical connection to the terminal member 70. In such a structure, the terminal members 70 is an example of the electricity supply member in the claims.

In the above-described embodiments, the electricity receiving electrodes 53 are joined to the terminal members 70 by means of the brazing portions 56. However, in order to mitigate the stress produced due to the difference in thermal expansion between the electricity receiving electrodes 53 and the terminal members 70, buffering members formed of, for example, a metal such as Kovar may be disposed between the electricity receiving electrodes 53 and the terminal members 70.

In the above-described embodiments, the coat layer 60 covers the greater part (for example, 80% or greater) of the surface of the heating resistor element 50, excluding its contact surfaces for contact with the electricity receiving electrodes 53 or the connection members 51. However, it is sufficient that the coat layer 60 covers at least a portion of the surface of the heating resistor element 50, excluding its contact surfaces for contact with the electricity receiving electrodes 53 or the connection members 51.

In the above-described embodiments, one heating resistor element 50 is disposed in the holding member 10. However, a plurality of heating resistor elements 50 may be disposed in the holding member 10. In such a structure, there are provided a plurality of sets each of which includes the electricity receiving electrodes 53 and the terminal members 70 and which correspond to the plurality of heating resistor elements 50.

The shape, number, forming material, etc. of each member constituting each of the heating devices 100 of the above-described embodiments are mere examples and can be changed variously. Also, the method of manufacturing the heating device 100 in the above-described embodiments is a mere example and can be changed variously.

In the above-described embodiments, the structure of the heating device 100 is described in detail. However, the technique disclosed in the present specification can be similarly applied to a general holding device which includes a ceramic member formed of a sintered ceramic material containing aluminum nitride as a main component, a heating resistor element formed of a metal and disposed in the ceramic member, and electrically conductive electricity supply members in contact with the heating resistor element and which holds an object on the surface of the ceramic member.

DESCRIPTION OF REFERENCE NUMERALS AND SYMBOLS

10: holding member 12: recess 20: support member 22: through hole 30: joining portion 50: heating resistor element 51: connection member 53: electricity receiving electrode 56: brazing portion 60: coat layer 70: terminal member 100: heating device PO: pore S1: holding surface S2: back surface S3: upper surface S4: lower surface S5: lower surface S6: upper surface TL: altered layer (carbide layer) W: semiconductor wafer

The invention claimed is:

1. A holding device comprising:
   a ceramic member having a first surface approximately perpendicular to a first direction and formed of a sintered ceramic material containing aluminum nitride as a main component;
   a heating resistor element formed of a metal and disposed in the ceramic member;
   an electricity supply connection member which is electrically conductive and is in contact with the heating resistor element; and
   an electricity supply terminal which is electrically conductive and is electrically connected to the electricity supply connection member,
   the holding device being adapted to hold an object on the first surface of the ceramic member and being characterized in that
   at least a portion of a surface of the heating resistor element, excluding its contact surface for contact with the electricity supply connection member, is covered with a coat layer formed of a nitride selected from the group consisting of AlN, AlTiN, AlTiSiN, AlZrN, AlTiCrN, VN, and NbN.

2. A holding device according to claim 1, wherein the coat layer has a thickness of 0.3 µm to 60 µm.

3. A holding device according to claim 1, wherein, in at least one cross section parallel to the first direction, pores present at an interface between the heating resistor element and the coat layer have an average diameter of 10 µm or less.

4. A holding device according to claim 1, wherein, in at least one cross section parallel to the first direction, the ratio of a sectional area of a carbide layer formed on the surface of the heating resistor element to a sectional area of the heating resistor element is 10% or less.

5. A holding device according to claim 4, wherein, in at least one cross section parallel to the first direction, the ratio of a sectional area of a carbide layer formed on the surface of the heating resistor element to a sectional area of the heating resistor element is 3% or less.

6. A holding device according to claim 1, wherein the electricity supply member contains no organic substance.

7. A holding device according to claim 1, wherein the heating resistor element has a mesh shape.

8. A method of manufacturing a holding device which comprises a ceramic member having a first surface approximately perpendicular to a first direction and formed of a sintered ceramic material containing aluminum nitride as a main component, a heating resistor element formed of a metal and disposed in the ceramic member, an electricity supply connection member which is electrically conductive and is in contact with the heating resistor element; and an electricity supply terminal which is electrically conductive and is electrically connected to the electricity supply connection member, and which holds an object on the first surface of the ceramic member,
   the method being characterized by comprising the steps of:
   forming a coat layer which is a nitride selected from the group consisting of AlN, AlTiN, AlTiSiN, AlZrN, AlTiCrN, VN, and NbN on at least a portion of a surface of the heating resistor element, excluding its contact surface for contact with the electricity supply connection member; and forming, through firing, the ceramic member in which the electricity supply member and the heating resistor element having the coat layer formed thereon are disposed.

* * * * *